US010606175B2

(12) United States Patent
Son et al.

(10) Patent No.: US 10,606,175 B2
(45) Date of Patent: Mar. 31, 2020

(54) METHOD OF MANUFACTURING CIRCUIT BOARD

(71) Applicant: LG CHEM, LTD., Seoul (KR)

(72) Inventors: Yong Goo Son, Daejeon (KR); Seung Heon Lee, Daejeon (KR); Han Min Seo, Daejeon (KR); Chang Yoon Lim, Daejeon (KR); Ji Eun Myung, Daejeon (KR); Kiseok Lee, Daejeon (KR)

(73) Assignee: LG CHEM, LTD., Seoul (KR)

( * ) Notice: Subject to any disclaimer, the term of this patent is extended or adjusted under 35 U.S.C. 154(b) by 53 days.

(21) Appl. No.: 15/741,993

(22) PCT Filed: Jan. 4, 2017

(86) PCT No.: PCT/KR2017/000081
§ 371 (c)(1),
(2) Date: Jan. 4, 2018

(87) PCT Pub. No.: WO2017/119706
PCT Pub. Date: Jul. 13, 2017

(65) Prior Publication Data
US 2018/0196346 A1 Jul. 12, 2018

(30) Foreign Application Priority Data

Jan. 4, 2016 (KR) .................. 10-2016-0000482
Jan. 3, 2017 (KR) .................. 10-2017-0000724

(51) Int. Cl.
*G03F 7/20* (2006.01)
*H05K 1/02* (2006.01)
*H05K 1/09* (2006.01)
*H01L 51/52* (2006.01)
*G03F 7/038* (2006.01)
*G03F 7/16* (2006.01)
*G03F 7/32* (2006.01)
*H05K 3/00* (2006.01)
*H05K 3/12* (2006.01)

(52) U.S. Cl.
CPC ............ *G03F 7/2002* (2013.01); *G03F 7/038* (2013.01); *G03F 7/162* (2013.01); *G03F 7/168* (2013.01); *G03F 7/322* (2013.01); *H01L 51/5212* (2013.01); *H05K 1/0274* (2013.01); *H05K 1/09* (2013.01); *H05K 3/0011* (2013.01); *H05K 3/12* (2013.01); *H05K 2201/0108* (2013.01); *H05K 2201/0326* (2013.01); *H05K 2201/0376* (2013.01); *H05K 2201/09681* (2013.01); *H05K 2203/0264* (2013.01); *H05K 2203/0278* (2013.01)

(58) Field of Classification Search
CPC .................................................. G03F 7/2002
See application file for complete search history.

(56) References Cited

U.S. PATENT DOCUMENTS

| 6,154,265 A | 11/2000 | Kamio et al. |
| 6,252,641 B1 | 6/2001 | Tsuzuki et al. |
| 9,054,042 B2 | 6/2015 | Fleissner et al. |
| 2004/0134875 A1 | 7/2004 | Fukami et al. |
| 2007/0013293 A1 | 1/2007 | Cok |
| 2011/0266543 A1* | 11/2011 | Moriwaki ........... G02F 1/13624 257/59 |
| 2013/0192872 A1 | 8/2013 | Hwang et al. |
| 2015/0129865 A1* | 5/2015 | Miyamoto ............ G02F 1/1368 257/43 |

FOREIGN PATENT DOCUMENTS

| CN | 103107285 | 5/2013 |
| EP | 0814142 | 12/1997 |
| JP | H0455823 | 2/1992 |
| JP | 06148659 | 5/1994 |
| JP | 08271921 | 10/1996 |
| JP | H1020319 | 1/1998 |
| JP | H10-62800 | 3/1998 |
| JP | H10-68923 | 3/1998 |
| JP | H10-82984 | 3/1998 |
| JP | H10-143091 | 5/1998 |
| JP | H11-7033 | 1/1999 |
| JP | H11-24089 | 1/1999 |
| JP | H11-160722 | 6/1999 |
| JP | 2000010106 | 1/2000 |
| JP | 2000187232 | 7/2000 |
| JP | 2000284724 | 10/2000 |
| JP | 2002258236 | 9/2002 |
| JP | 2004-179181 | 6/2004 |
| JP | 2009059666 | 3/2009 |
| JP | 2011249075 | 12/2011 |
| JP | 2012-175094 | 9/2012 |
| JP | 2014512075 | 5/2014 |
| JP | 2014216175 | 11/2014 |
| KR | 10-2012-0078642 | 7/2012 |

* cited by examiner

Primary Examiner — Kathleen Duda
(74) Attorney, Agent, or Firm — Dentons US LLP

(57) ABSTRACT

The present specification relates to a manufacturing method of a circuit board. More particularly, the present specification relates to a circuit board and a manufacturing method of an electronic device including the same.

3 Claims, 9 Drawing Sheets

[Figure 1]
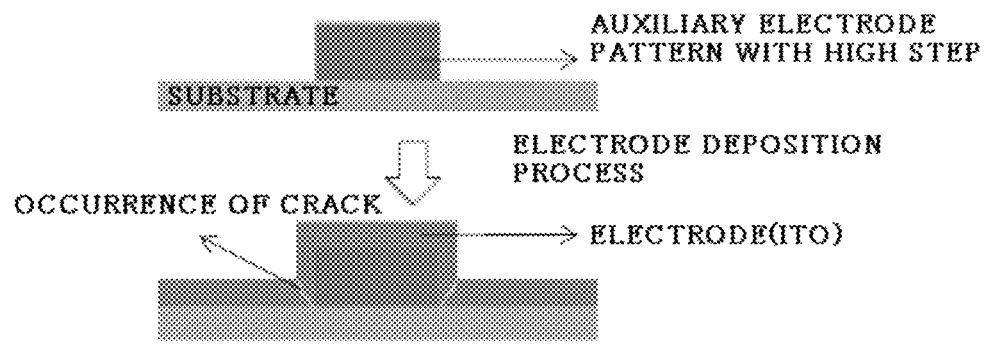
[Figure 2]
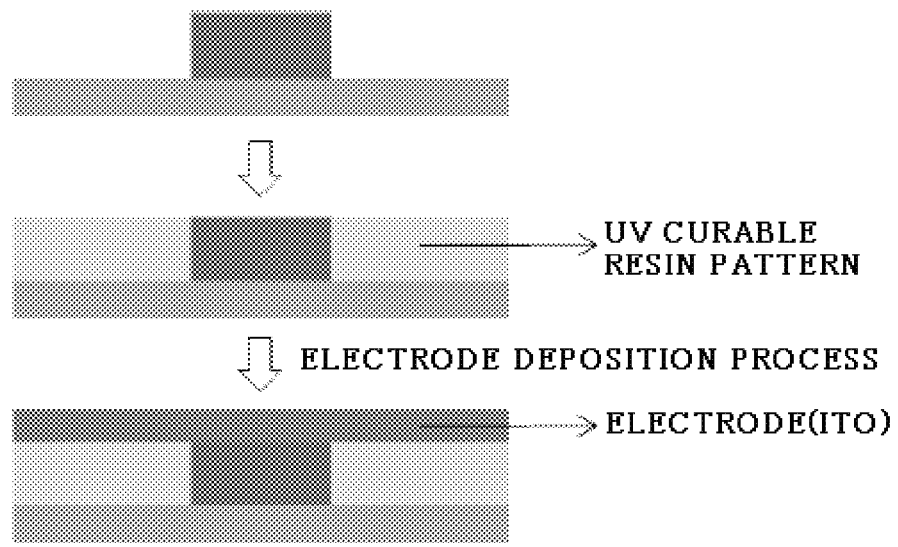

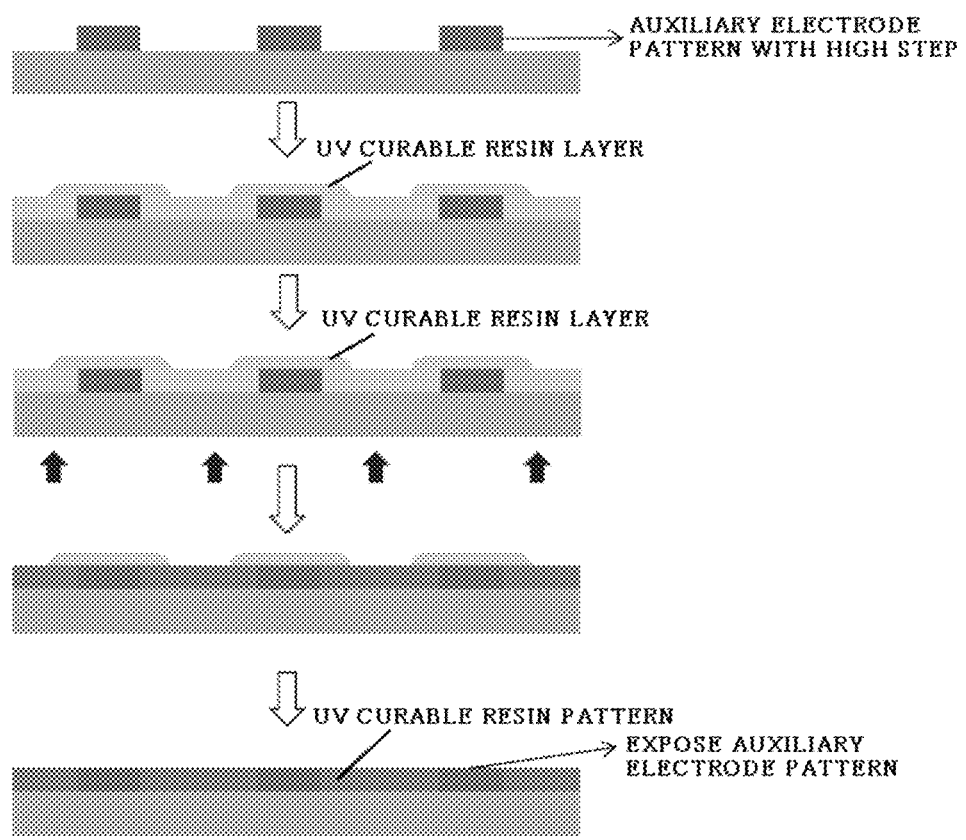
[Figure 3]

[Figure 4]
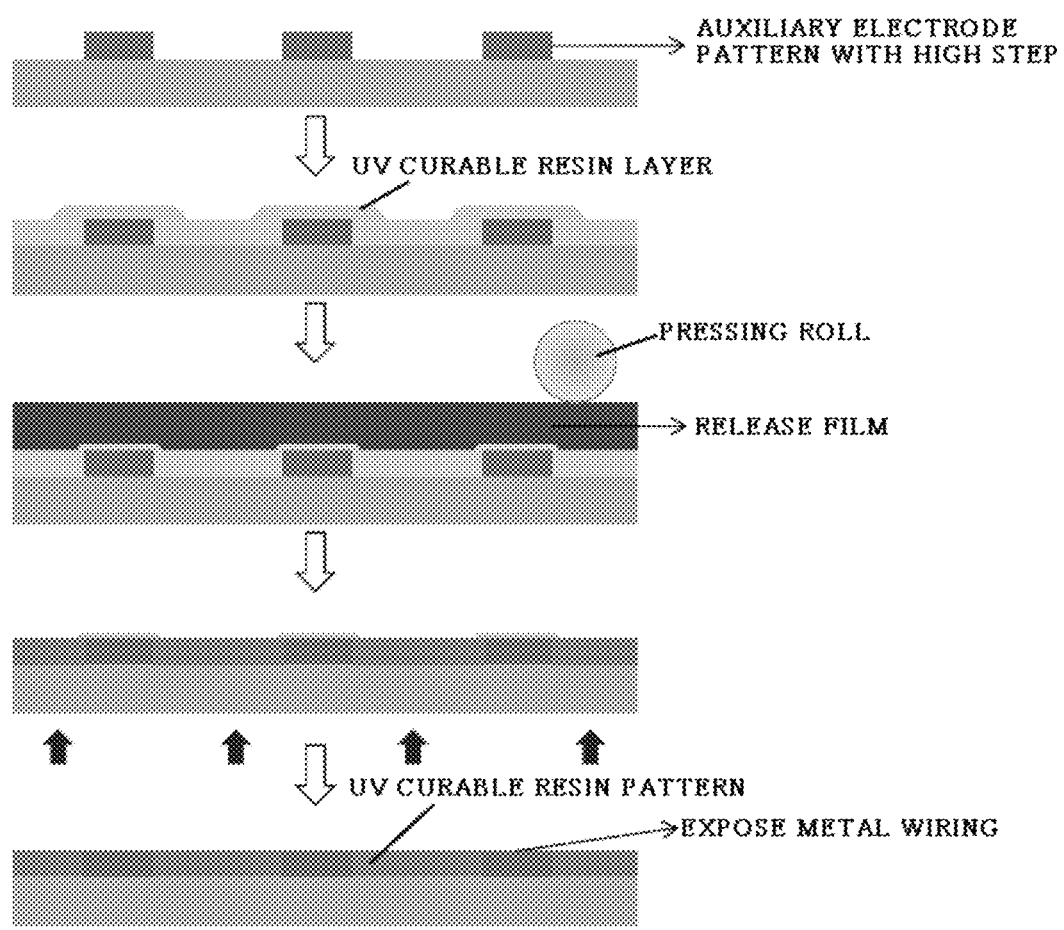

[Figure 5]
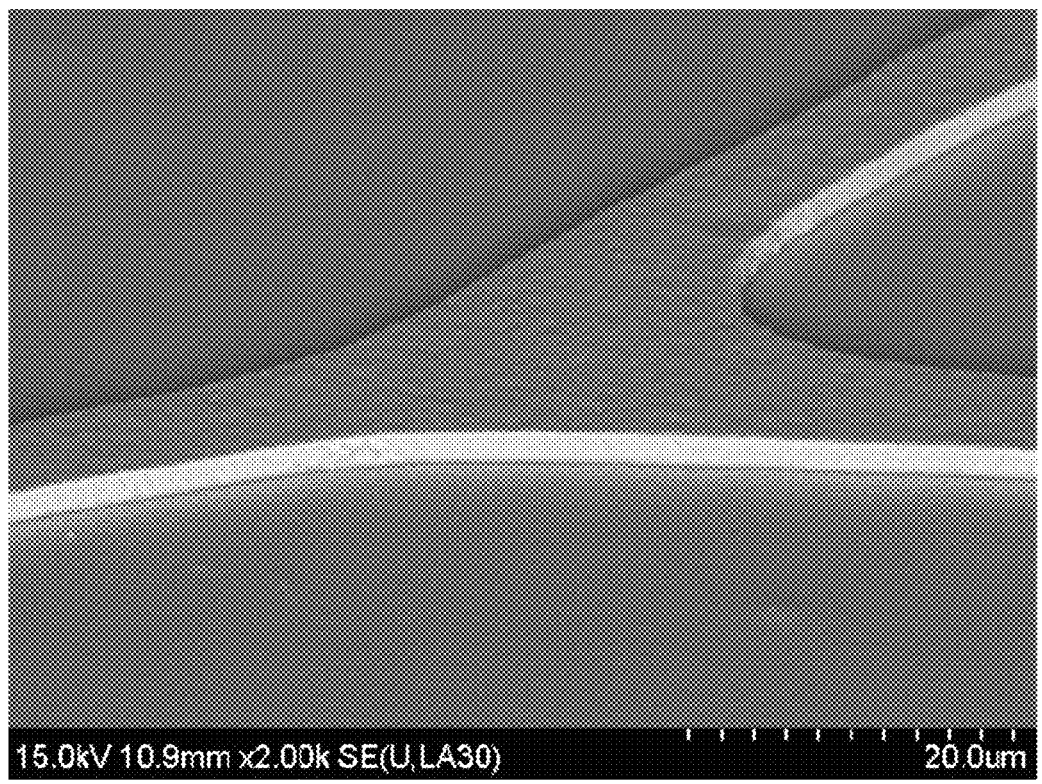

[Figure 6]
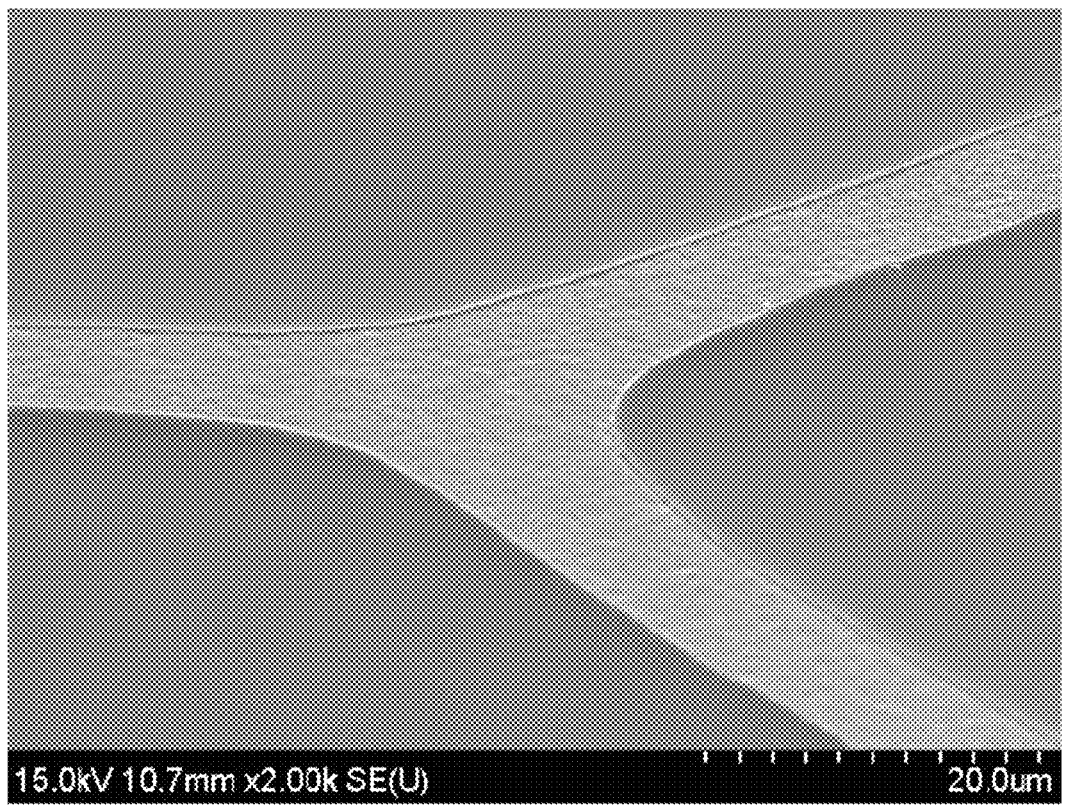

[Figure 7]
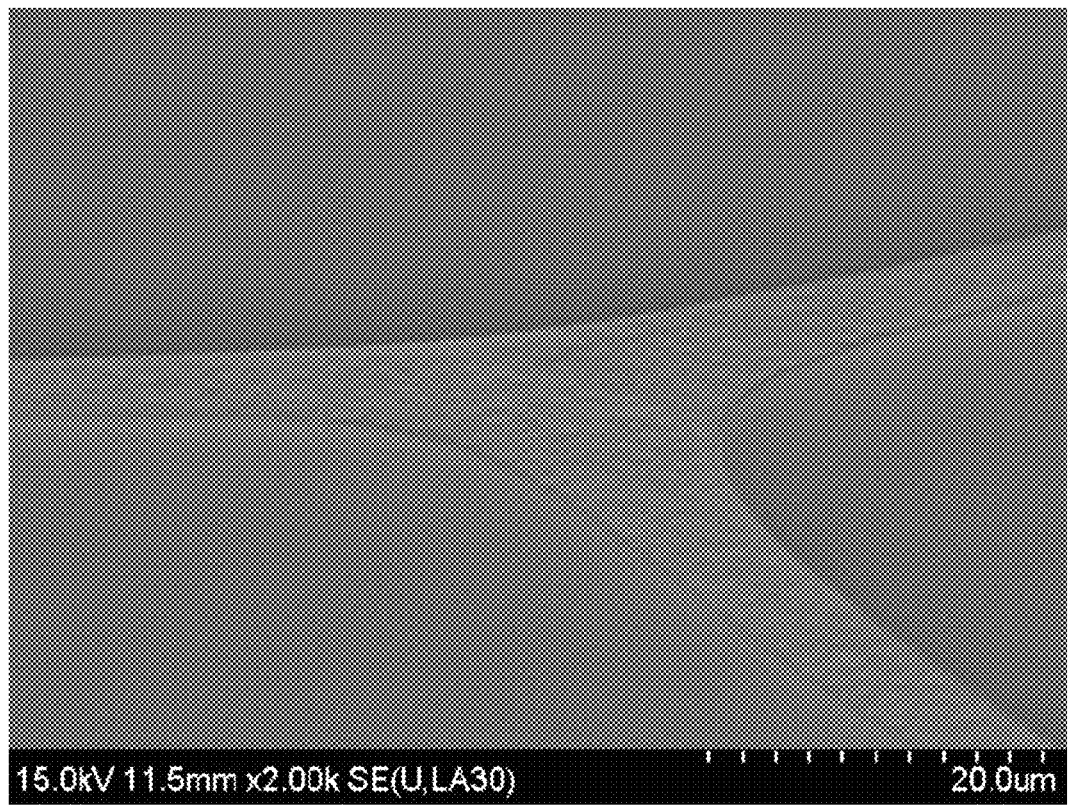

[Figure 8]
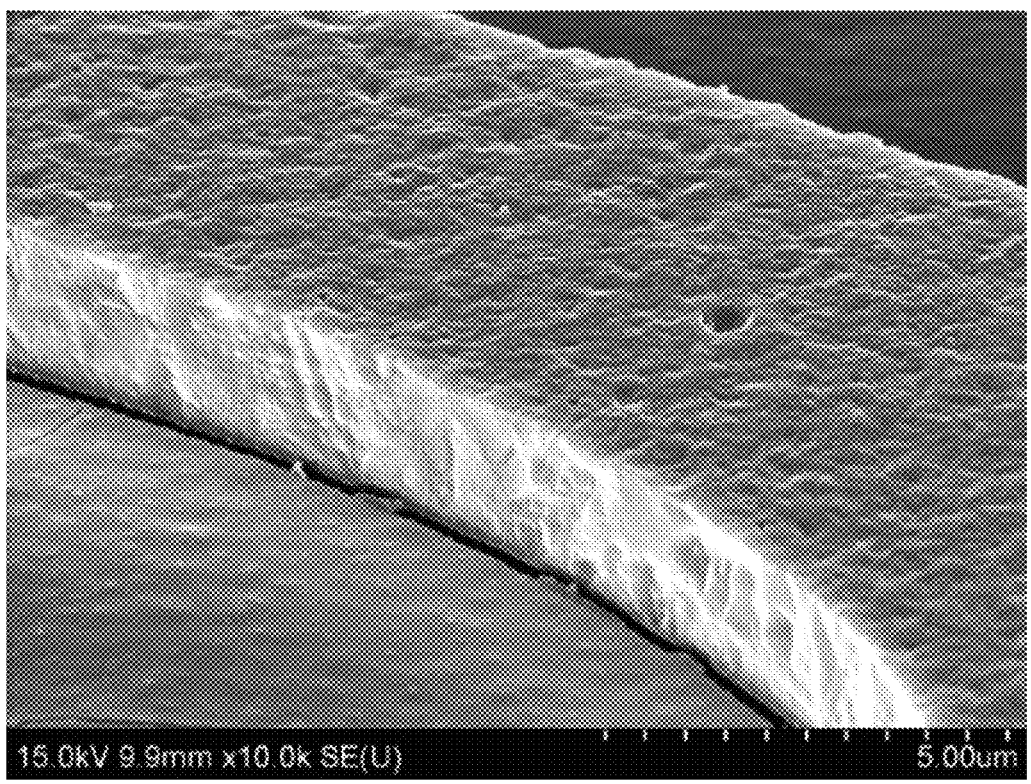

[Figure 9]
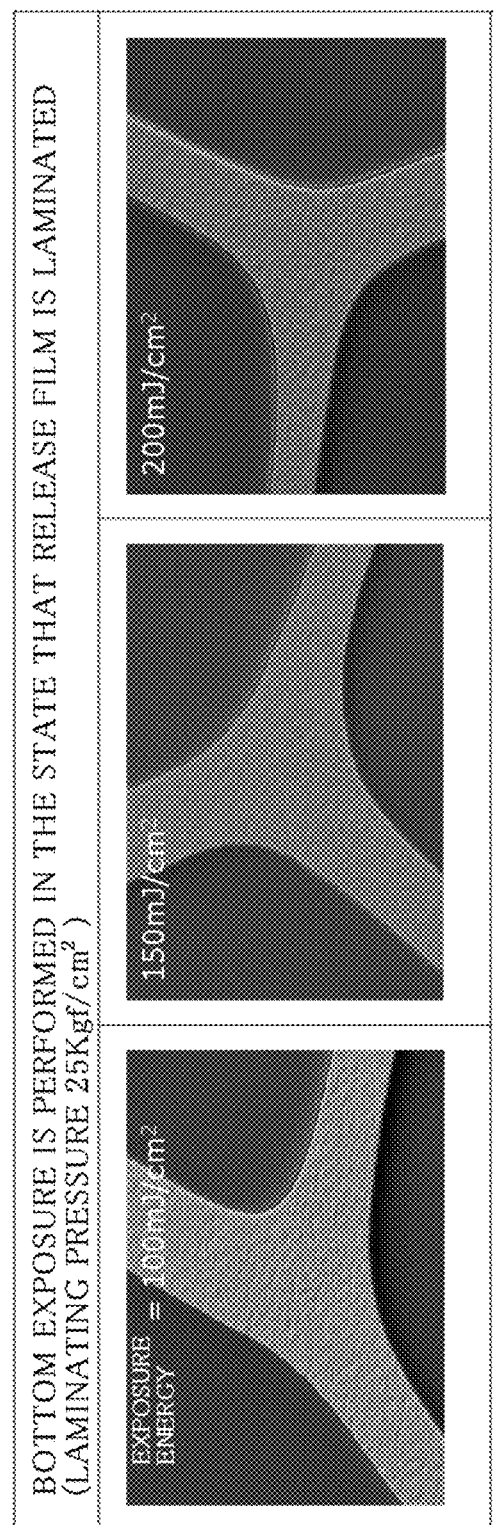

[Figure 10]
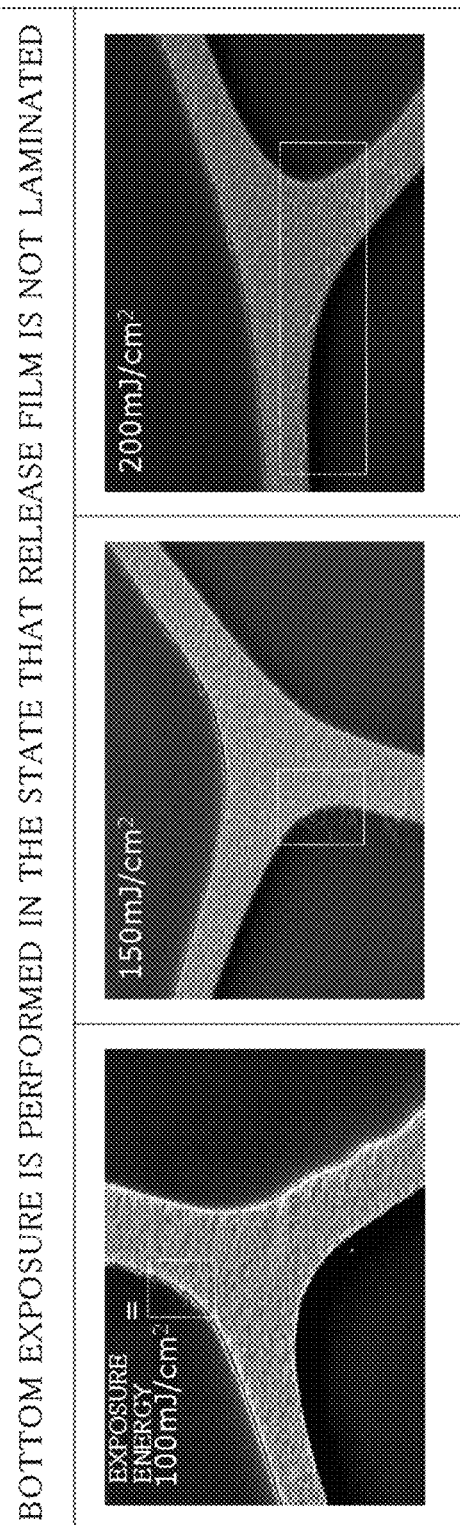

METHOD OF MANUFACTURING CIRCUIT BOARD

TECHNICAL FIELD

This application is a National Stage Application of International Application No. PCT/KR2017/000081 filed on Jan. 4, 2017, which claims priority to and the benefit of Korean Patent Application No. 10-2016-0000482 filed in the Korean Intellectual Property Office on Jan. 4, 2016 and Korean Patent Application No. 10-2017-0000724 filed in the Korean Intellectual Property Office on Jan. 3, 2017, all of which are incorporated herein in their entirety by reference for all purposes as if fully set forth herein.

The present specification relates to a manufacturing method of a circuit board. More particularly, the present specification relates to a circuit board and a manufacturing method of an electronic device including the same.

BACKGROUND ART

Recently, in an electronic device such as a display or an organic light emitting diode, it has been required that a transparent electrode is formed in an effective screen portion. To this end, a transparent conductive film formed of a material such as ITO or ZnO is used as the electrode, but there is a problem of low conductivity. In order to improve the conductivity, an attempt has been made to form an auxiliary electrode having an auxiliary electrode pattern on a transparent conductive film electrode for the purpose of improving conductivity.

DETAILED DESCRIPTION OF THE INVENTION

Technical Problem

The present specification has been made in an effort to provide a manufacturing method of a circuit board. Specifically, the present specification has been made in an effort to provide a circuit board and a manufacturing method of an electronic device including the same.

Technical Solution

An exemplary embodiment of the present specification provides a manufacturing method of a circuit board including: forming an auxiliary electrode pattern having a thickness of 1 µm or more on a transparent substrate; forming a UV curable resin layer by applying a UV curable resin composition on the transparent substrate provided with the auxiliary electrode pattern; laminating a release film on the UV curable resin layer; pressing the surface of release film; an exposure step of irradiating light onto the opposite side of the surface of the transparent substrate on which the auxiliary electrode pattern is formed; and forming a UV curable resin pattern by developing a portion of the UV curable resin layer to which the light is not irradiated after exposure, and further including removing the release film before or after the exposure.

Advantageous Effects

The method according to the exemplary embodiment of the present specification has an advantage of forming a transparent electrode on an auxiliary electrode having a large thickness without cracks.

The method according to the exemplary embodiment of the present specification has an advantage of forming an electrode which is transparent and has a low resistance.

BRIEF DESCRIPTION OF DRAWINGS

FIG. 1 illustrates problems in the related art.

FIG. 2 illustrates an electrode pattern manufactured by a method according to the present specification.

FIG. 3 illustrates a sequence of a method according to a first exemplary embodiment of the present specification.

FIG. 4 illustrates a sequence of a method according to a second exemplary embodiment of the present specification.

FIG. 5 is a scanning electron microscopy (SEM) image of an auxiliary electrode pattern of Example 1.

FIG. 6 is an SEM image illustrating a UV curable resin pattern and an exposed auxiliary electrode pattern in Example 2.

FIG. 7 is an SEM image illustrating a surface deposited with ITO in Example 2.

FIG. 8 is an SEM image illustrating a surface deposited with ITO in Comparative Example 1.

FIG. 9 is an SEM image illustrating a UV curable resin pattern and an exposed auxiliary electrode pattern in Examples 1 to 3.

FIG. 10 is an SEM image illustrating a UV curable resin pattern and an exposed auxiliary electrode pattern in Comparative Examples 2 to 4.

BEST MODE

Hereinafter, the present specification will be described in detail.

The present specification provides a manufacturing method of a circuit board including forming an auxiliary electrode pattern having a thickness of 1 µm or more on a transparent substrate; forming a UV curable resin layer by applying a UV curable resin composition on the transparent substrate provided with the auxiliary electrode pattern; an exposure step of irradiating light on the opposite side of the surface of the transparent substrate on which the auxiliary electrode pattern is formed; and forming a UV curable resin pattern by developing a portion of the UV curable resin layer to which the light is not irradiated after exposure.

The manufacturing method of the circuit board includes forming the auxiliary electrode pattern having a thickness of 1 µm or more on the transparent substrate.

The transparent substrate may be a rigid substrate or a flexible substrate. Specifically, the transparent substrate is preferably a flexible substrate, and the flexible substrate may be a plastic substrate or a plastic film. The plastic substrate or the plastic film is not particularly limited, but for example, may include at least one of polyacrylate, polypropylene (PP), polyethylene terephthalate (PET), polyethylene ether phthalate, polyethylene phthalate, polybutylene phthalate, polyethylene naphthalate (PEN), polycarbonate (PC), polystyrene (PS), polyether imide, polyether sulfone, polydimethyl siloxane (PDMS), polyetheretherketone (PEEK), and polyimide (PI).

The substrate may use a substrate having high transparency, and the light transmittance of the substrate may be 50% or more.

The method of forming the auxiliary electrode pattern on the transparent substrate is not particularly limited, but for example, may be a roll printing method, an inkjet printing method, a screen printing method, a deposition method, a photolithography method, an etching method, and the like.

The auxiliary electrode pattern may also be a regular shape, but may also be an irregular shape. For example, the shape may be a stripe, a rhombus, a square grid, a circle, a wave pattern, a grid, a two-dimensional grid, and the like, but is not limited to a specific shape. If the auxiliary electrode pattern needs to be designed so that light emitted from a certain light source does not hinder optical properties due to diffraction and interference, the pattern with minimized pattern regularity may also be used. For this end, a wave pattern, a sine wave, and a pattern in which the spacing and the line thickness of a lattice structure are irregularly formed may also be used. If necessary, the auxiliary electrode pattern may be a combination of two or more patterns. The auxiliary electrode pattern may also include a boundary line of figures forming a Voronoi diagram or a boundary line forming a Delaunay triangle. The line forming the auxiliary electrode pattern may be a straight line, but may be variously modified such as a curved line, a wavy line, and a zigzag line.

A thickness of the auxiliary electrode pattern is 1 μm or more, particularly 1 μm or more and 10 μm or less, and more particularly 1 μm or more and 3 μm or less.

A line width of the auxiliary electrode pattern may be 3 μm or more and 100 μm or less and particularly 5 μm or more and 50 μm or less.

The manufacturing method of the circuit board includes forming a UV curable resin layer by coating the UV curable resin composition on the transparent substrate provided with the auxiliary electrode pattern.

In the present specification, the UV curable resin means a photosensitive material in which a chemical change of a resist layer material occurs in the exposed area during exposure and a material unexposed to light is removed during development.

The UV curable resin composition is not particularly limited as long as the UV curable resin composition contains a resin that is cured by ultraviolet rays, but the UV curable resin composition may be a negative photoresist composition. Specifically, the negative photoresist composition refers to a composition containing a polymer that is exposed to the light to change resistance to a developer and the negative photoresist composition may include a polymer that is exposed to the light to generate resistance to a developer.

The UV curable resin composition may further include at least one of a photoinitiator, a crosslinking agent, an additive and a solvent.

The polymer, the photoinitiator, the crosslinking agent, the additive and the solvent are not particularly limited, and materials generally used in the art may be adopted.

The method of applying the UV curable resin composition is not particularly limited, and for example, may include bar coating, slot die coating, spin coating, comma coating, microgravure coating, or dip coating.

The forming of the UV curable resin layer may include applying the UV curable resin composition on the transparent substrate provided with the auxiliary electrode pattern and drying the applied UV curable resin composition.

The drying method is not particularly limited, but may be a hot air drying method or an infrared drying method.

The manufacturing method of the circuit board may further include laminating a release film on the UV curable resin layer; and pressing the surface of the release film, after the forming of the UV curable resin layer.

The release film is not particularly limited as long as the release film is laminated on the UV curable resin layer and then removed without damaging the UV curable resin layer, and for example, the release film may include at least one of a silicon-based release film and a fluorine-based release film.

The method of pressing the surface of the release film is not particularly limited, but it is possible to press the surface of the release film using a pressing plate, a thermal pressing plate, a pressing roll or a thermal pressing roll. In this case, the pressing time and the pressing force may be changed and selected according to the material and thickness of the release film and the material of the UV curable resin layer.

The manufacturing method of the circuit board may further include removing the release film, before or after the exposure. Specifically, the release film may be removed before or after the exposure.

The method of removing the release film is not particularly limited, but the release film may be removed by a bonding roll.

The manufacturing method of the circuit board includes an exposure step of irradiating light on the opposite side of the surface of the transparent substrate on which the auxiliary electrode pattern is formed.

The exposure conditions in the exposure step may be adjusted according to the properties of the applied photoresist, and are not particularly limited. When the UV curable resin layer is not sufficiently exposed, the UV curable resin layer is not sufficiently cured, and thus, the surface of the UV curable resin layer may be damaged during the development process and a gap may be generated between the auxiliary electrode pattern and the UV curable resin layer. On the other hand, when the UV curable resin layer is excessively exposed, all or a part of the UV curable resin layer formed on the auxiliary electrode is exposed and developed to cause a problem that all or a part of the upper portion of the auxiliary electrode is not exposed after development.

The manufacturing method of the circuit board includes forming a UV curable resin pattern by developing a portion of the UV curable resin layer to which the light is not irradiated after the exposure.

The portion of the UV curable resin layer to which the light is not irradiated after the exposure is a portion of the UV curable resin layer positioned on the auxiliary electrode pattern, and a portion of the UV curable resin layer positioned on the auxiliary electrode pattern does not receive the irradiated light by blocking the light by the auxiliary electrode pattern.

The portion of the UV curable resin layer to which the light is not irradiated after the exposure is developed and then the UV curable resin on the auxiliary electrode pattern is developed by a developer to expose the auxiliary electrode pattern.

The portion of the UV curable resin layer which is irradiated with light after the exposure is the portion which receives the light irradiated from the opposite side of the surface of the transparent substrate on which the auxiliary electrode pattern is formed because the auxiliary electrode pattern is not formed. Specifically, the portion of the UV curable resin layer which is irradiated with light after the exposure is a part of the UV curable resin layer formed between the auxiliary electrode patterns. The UV curable resin pattern formed by developing that portion of the UV curable resin layer to which the light is not irradiated after the exposure may be formed between the auxiliary electrode patterns.

A difference between the thickness of the auxiliary electrode pattern and the thickness of the UV curable resin pattern may be 200 nm or less. Particularly, the difference between the thickness of the auxiliary electrode pattern and the thickness of the UV curable resin pattern may be 0 nm or more and 200 nm or less and 50 nm or more and 150 nm or less. In this case, there is an advantage that the transparent electrode layer formed on the transparent substrate provided with the auxiliary electrode pattern and the UV curable resin pattern does not have cracks due to the step.

The method of developing the portion of the UV curable resin layer to which the light is not irradiated is not particularly limited, but for example, a developer may be applied or sprayed onto the exposed UV curable resin layer, or the exposed UV curable resin layer may be immersed in the developer.

The manufacturing method of the circuit board may further include forming a transparent electrode layer on the transparent substrate provided with the auxiliary electrode pattern and the UV curable resin pattern, after the forming of the UV curable resin pattern.

The method of forming the transparent electrode layer is not particularly limited, but a transparent electrode material may be deposited on the transparent substrate provided with the auxiliary electrode pattern and the UV curable resin pattern.

The transparent electrode layer may be a transparent metal oxide layer or a metal layer having light transmittance due to a small thickness.

The transparent electrode layer may be formed of a metal oxide layer such as indium tin oxide (ITO), ZnO, indium zinc oxide (IZO) or the like or formed of a thin metal such as Al, Cu, or the like.

The manufacturing method of the circuit board may further include forming sequentially an organic layer and an additional electrode layer on the electrode layer.

When the auxiliary electrode and the electrode layer correspond to the electrode layer of the electronic device, an additional layer may be further formed according to a type of electronic device. For example, an organic layer and an additional electrode layer may be further formed on the electrode layer according to a type of electronic device.

The electronic device includes a touch panel, a solar cell, an organic light emitting diode, a lighting, and a liquid crystal display.

In the electronic device, cases of providing transparent electrodes are increased for transparency and for transparency of the electrode, metal oxides need to be used or metal layers need to be thinly deposited. In the case of the metal oxide, in spite of a metal having a high resistance and good conductivity, when the metal layer is deposited thinly enough to ensure transparency, the resistance is increased.

Accordingly, the auxiliary electrode pattern may be provided to reduce the resistance of the transparent electrode.

There is an increasing need to further lower the resistance of the auxiliary electrode in accordance with the trend of increasing the applications of the electronic device such as increasing the size of the electronic device or applying flexibility. As the method of lowering the resistance of the auxiliary electrode pattern, a method of increasing the thickness of the auxiliary electrode pattern may be considered. However, in this case, as illustrated in FIG. 1, cracks in the deposited electrode layer are formed due to the step between the auxiliary electrode pattern and the substrate to cause an electrical short or inter-wiring short.

In order to solve such a problem, as illustrated in FIG. 2, a planarization layer capable of reducing the step between the auxiliary electrode pattern and the substrate may be formed.

Hereinafter, the present specification will be described in more detail through Examples. However, the following Examples are just to exemplify the present specification and the present specification is not limited thereto.

EXAMPLES

Preparation Example

Preparation of UV Curable Resin Composition 16 g of an acrylate resin having a weight average molecular weight of 10,100 g/mol, an acid value of 77 mgKOH/g, and a ratio of an acryl reaction group of 30 mol %, 7.5 g of dipentaerythritol hexaacrylate, 1 g of an oxym-based photoinitiator, and 0.5 g of a Glide-410 surfactant were dissolved in 75 g of propylene glycol monomethyl ether acetate (PGMEA) and then filtered with a filter having a size of 0.1 μm to prepare a UV curable resin composition.

Example 1

A resist ink pattern having a line width of 15 μm was formed on a polyethylene terephthalate (PET) film deposited with a copper having a thickness of 2 μm by a reverse offset printing process, and then a copper auxiliary electrode pattern having a thickness of 2 μm and a line width of 8 μm was formed by a copper etching process.

The UV curable resin composition prepared in Preparation Example was coated on a substrate provided with the copper auxiliary electrode having the thickness of 2 μm and the line width of 8 μm by a spin coating method and then dried with hot air at 80° C. for 3 minutes to form a UV curable resin composition layer.

A fluorine-based release film was laminated on the UV-curable resin composition layer and then pressed with a pressing roll under a pressure condition of 25 Kgf/cm$^2$.

After irradiating an exposure amount of 100 mJ/cm$^2$ onto the bottom of the substrate provided with the copper auxiliary electrode pattern and the UV curable resin composition layer, the release film was removed by a bonding roll. The substrate from which the release film was removed was additionally dried with hot air at 120° C. for 3 minutes.

The UV curable resin composition layer provided on the copper auxiliary electrode pattern was removed by developing the substrate with a KOH 0.05 wt % developer for 2 minutes.

ITO having a thickness of 100 nm was deposited on the exposed copper auxiliary electrode pattern.

Example 2

A UV curable resin composition was prepared in the same manner as Example 1 except that an exposure amount was changed to 150 mJ/cm$^2$.

Example 3

A UV curable resin composition was prepared in the same manner as Example 1 except that an exposure amount was changed to 200 mJ/cm$^2$.

Comparative Example 1

The UV curable resin composition layer in Example was not formed and ITO with a thickness of 100 nm was deposited directly on the PET film provided with the copper auxiliary electrode pattern with the thickness of 2 μm and the line width of 8 μm.

Comparative Example 2

A resist ink pattern having a line width of 15 μm was formed on a polyethylene terephthalate (PET) film deposited with copper having a thickness of 2 μm by a reverse offset printing process, and then a copper auxiliary electrode pattern having a thickness of 2 μm and a line width of 8 μm was formed by a copper etching process.

The UV curable resin composition prepared in Preparation Example was coated on a substrate provided with the copper auxiliary electrode having the thickness of 2 μm and the line width of 8 μm by a spin coating method and then dried with hot air at 120° C. for 3 minutes to form a UV curable resin composition layer.

The UV curable resin composition layer provided on the copper auxiliary electrode pattern was removed by irradiating an exposure amount of 100 mJ/cm² onto the bottom of the substrate provided with the copper auxiliary electrode pattern and the UV curable resin composition layer and developing the substrate with a KOH 0.05 wt % developer for 2 minutes.

ITO having a thickness of 100 nm was deposited on the exposed copper auxiliary electrode pattern.

Comparative Example 3

A UV curable resin composition was prepared in the same manner as Comparative Example 2, except that an exposure amount was changed to 150 mJ/cm².

Comparative Example 4

A UV curable resin composition was prepared in the same manner as Comparative Example 2, except that an exposure amount was changed to 200 mJ/cm².

Test Example 1

Measurement of Scanning Electron Microscopy (SEM)

An SEM image of the auxiliary electrode pattern provided on the PET film was illustrated in FIG. 5.

An SEM image illustrating the UV curable resin pattern and the exposed auxiliary electrode pattern in Example 1 was illustrated in FIG. 6.

SEM images illustrating surface deposited with ITO in Examples 1 to 3 and Comparative Examples 1 to 4 were illustrated in FIGS. 7 to 10, respectively.

When comparing FIG. 7 (Example 2) with FIG. 8 (Comparative Example 1), it can be seen that when the UV curable resin composition layer is provided, ITO cracks do not occur on a boundary of the auxiliary electrode.

When comparing FIG. 9 (Examples 1 to 3) with FIG. 10 (Comparative Examples 2 to 4), like Examples 1 to 3, when the bottom exposure is performed in the state that the release film is laminated, it can be seen that the resin composition layer does not remain on the auxiliary electrode, and in Comparative Examples 2 to 4, it can be seen that the remaining resin composition layer is present as illustrated in FIG. 10.

Test Example 2

Measurement of Resistance

In Examples 1 to 3 and Comparative Examples 1 to 4, after 100 nm of ITO was deposited on the auxiliary electrode pattern, a sheet resistance of the auxiliary electrode substrate was measured using a sheet resistance meter of Mitsubishi Chemical Corporation MCP-T600.

TABLE 1

| | Occurrence of ITO crack on boundary of auxiliary electrode pattern | Sheet resistance (Ω/sq) after depositing ITO 100 nm |
| --- | --- | --- |
| Example 1 | None | 1.2 |
| Example 2 | None | 1.3 |
| Example 3 | None | 1.2 |
| Comparative Example 1 | Occurrence | 1.4 |
| Comparative Example 2 | None | 4.6 |
| Comparative Example 3 | None | 12.3 |
| Comparative Example 4 | None | 16.8 |

Through Table 1, it can be seen that Comparative Examples 2 to 4 in which the resin composition remained on the auxiliary electrode have a high sheet resistance. It can be seen that the remaining resin composition hinders the effect of reducing the sheet resistance of the ITO of the auxiliary electrode.

The invention claimed is:

1. A manufacturing method of a circuit board, comprising:
   forming an auxiliary electrode pattern having a thickness of 1 μm or more on a transparent substrate;
   forming a UV curable resin layer by applying a UV curable resin composition on the transparent substrate provided with the auxiliary electrode pattern;
   laminating a fluorine-based release film on the UV curable resin layer after forming the UV curable resin layer;
   pressing the surface of the release film;
   an exposure step of irradiating light onto the opposite side of the surface of the transparent substrate on which the auxiliary electrode pattern is formed;
   forming a UV curable resin pattern by removing a portion of the UV curable resin layer to which the light is not irradiated after exposure;
   forming an electrode layer on the transparent substrate provided with the auxiliary electrode pattern and the UV curable resin pattern, after the forming of the UV curable resin pattern, and
   removing the release film before or after the exposure using a bonding roll.

2. The manufacturing method of the circuit board of claim 1, further comprising:
   forming an organic layer on the electrode layer on the transparent substrate provided with the auxiliary electrode pattern and the UV curable resin pattern and forming an additional electrode layer on the organic layer.

3. The manufacturing method of the circuit board of claim 1, wherein a difference between the thickness of the auxiliary electrode pattern and the thickness of the UV curable resin pattern is 200 nm or less.

* * * * *